United States Patent [19]

Banu

[11] Patent Number: 4,972,162

[45] Date of Patent: Nov. 20, 1990

[54] WIDEBAND RELAXATION OSCILLATOR UTILIZING PARASITIC CAPACITANCES

[75] Inventor: Mihai Banu, Murray Hill, N.J.

[73] Assignee: AT&T Bell Laboratories, Murray Hill, N.J.

[21] Appl. No.: 156,274

[22] Filed: Feb. 16, 1988

[51] Int. Cl.[5] ............................................ H03K 3/354
[52] U.S. Cl. ................................ 331/111; 331/113 R; 331/143
[58] Field of Search ..................... 331/111, 113 R, 143

[56] References Cited

U.S. PATENT DOCUMENTS

| | | | |
|---|---|---|---|
| 3,559,098 | 1/1971 | Chandos | 331/111 |
| 3,693,112 | 9/1972 | Briggs | 331/111 |
| 4,623,851 | 11/1986 | Abou | 331/111 |
| 4,623,852 | 11/1986 | Abou et al. | 331/111 |

OTHER PUBLICATIONS

Grebene, A. B., *Bipolar and MOS Analog Integrated Circuit Design*, J. Wiley Sons, 1984, Chapter 11.

Primary Examiner—Siegfried H. Grimm
Attorney, Agent, or Firm—Geoffrey D. Green

[57] ABSTRACT

A high-frequency wideband relaxation oscillator utilizing parasitic capacitances of the switching transistors as charging capacitors and capable of being fabricated in both CMOS and NMOS technology. When fabricated in NMOS technology the switching transistors are implemented as charge-enhancement devices and additional charge-depletion devices are utilized to counteract detrimental parasitic capacitances.

6 Claims, 5 Drawing Sheets

WIDEBAND RELAXATION OSCILLATOR UTILIZING PARASITIC CAPACITANCES

FIELD OF THE INVENTION

The invention relates to the field of electronic circuits, both digital and analog, and especially to integrated circuits fabricated in metal oxide semiconductor (MOS) and complementary MOS technology and being capable of wideband operation while also being capable of high frequency operation.

BACKGROUND OF THE INVENTION

According to the conventional belief of those skilled in the art of circuit design, high frequency and wideband frequency operation are incompatible requirements in the same circuit. By high frequency, it is meant frequencies substantially greater than one MHz and tending upwards into the GHz range. For example, it is generally accepted that tuned oscillators (e.g., LC-tuned) are capable of operation at high frequencies, but have a narrow band of frequency adjustment for a given tuning element. Relaxation oscillators, for example (e.g., emitter-coupled multivibrators), on the other hand, have a wide range of frequency adjustment, but have been limited to a relatively low maximum frequency operation in the range of one MHz. For a detailed discussion of these conventional principles see, for example, Chapter 11 of Alan B. Grebene's textbook entitled *Bipolar and MOS Analog Integrated Circuit Design*, John Wiley Sons, 1984.

In the present and future environment in which high speed telecommunications and other demanding electronics are so important, it would be advantageous to have available circuits of a more universal nature. Importantly, such circuits could be utilized in a wide variety of applications having different requirements regarding frequency operation and bandwidth, without circuit redesign or readjustment.

SUMMARY OF THE INVENTION

An advance in the art of circuit design is obtained in a circuit comprising a switched capacitive network, a current source having first and second terminals and a clock phase generating means. The network is connected to the first terminal of the current source and has means for generating signals on a first output port in first and second repetitive clock phases and for generating on a second port signals 180 degrees out-of-phase with the signals on the first port. The clock phase generating means is responsive to the signals on the first and second ports for generating the first and second clock phases. The switched capacitive network includes a first capacitance between the second port and the second terminal of the current source. Switch means are included for charging the first capacitance and discharging the second capacitance during the first clock phases, and for charging the second capacitance and discharging the first capacitance during the second clock phases.

In a preferred embodiment, the network is contained within an integrated circuit, and the switch means comprise integrated elements. The first and second capacitances are parasitic capacitances of the switch means. With the use of fine-line MOS fabrication processes and circuits designed in accordance with the invention, circuits in general and relaxation oscillators in particular can be designed with very wide operating bandwidths and very high maximum frequencies in the range from below 100 KHz to over 1 GHz. The resulting circuits are fully integrable. The frequency of operation can be adjusted by digital and analog (voltage) control signals. In one mode of operation, the digital control signals provide coarse tuning, and the analog voltage control provides fine tuning. Alternatively, the analog control may be used to generate wide frequency sweeps. Oscillators, for example, designed in accordance with the invention are particularly useful in monolithic phase-locked loop applications where the inherent low temperature stability of relaxation oscillators is not important. However, the invention is not limited to such applications.

DETAILED DESCRIPTION

Figure 1:
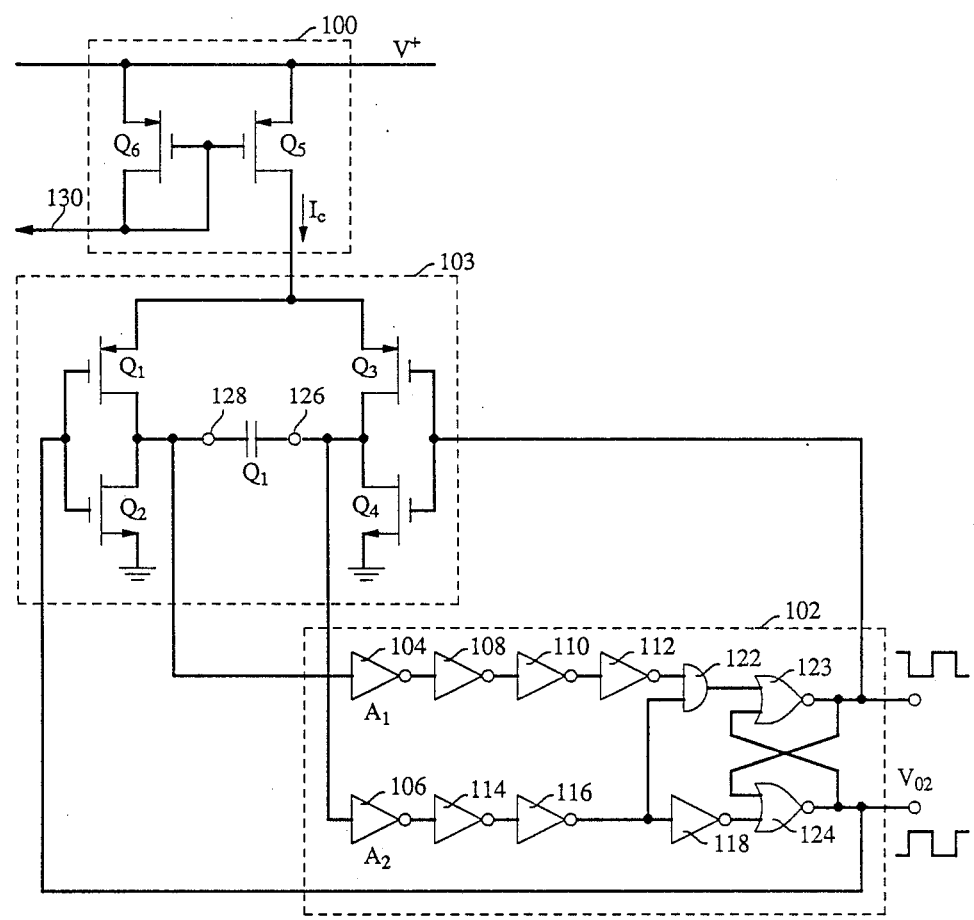
FIG. 1 shows a prior art CMOS oscillator which is illustrative of the frequency bandwidth and maximum high frequency operation previously obtainable in a single circuit.

A CMOS prior art oscillator is shown in FIG. 1. It consists of a constant current source 100, a charging circuit 103 with transistors Q1 through Q4, and charging capacitor C1, and a clock generating circuit 102, also referred to as a reversal circuit. The reversal circuit consists of a number of inverters 104 through 118, and AND gate 122 and R-S flip-flop formed by NOR gates 123 and 124. The first two inverters 104 and 106 are set to sense a threshold voltage before triggering an output pulse. The oscillator is arranged so that if transistors Q1–Q4 are on, then transistors Q2–Q3 are off, and vice versa. When Q1 and Q4 are on, the node 126 is clamped to ground through Q4, and C1 charges via Q1 with the current through transistor Q5. The Q5 current and thus the frequency of oscillation is controlled by the current on lead 130. When the voltage at node 128 reaches the threshold voltage of inverter 104, 104 changes state and resets the flip-flop formed by NOR gates 123 and 124. This causes Q2 and Q3 to turn on and Q1 and Q4 to turn off. Node 128 is clamped to ground through Q2; node 126 instantaneously drops to a negative voltage and then begins to charge through Q3. When node 126 reaches the threshold voltage of inverter 106, the flip-flop changes state, and the process begins again.

At least two things limit the maximum frequency and bandwidth operation of the circuit of FIG. 1. First, the CMOS relaxation oscillator uses a discrete charging capacitor C1 and does not take advantage of parasitic capacitances inherent and unavoidable in the MOS devices. Second, the reversal circuit 102 is necessarily complicated and introduces a minimum of seven gate delays to prevent undesirable triggering modes.

Figure 2:
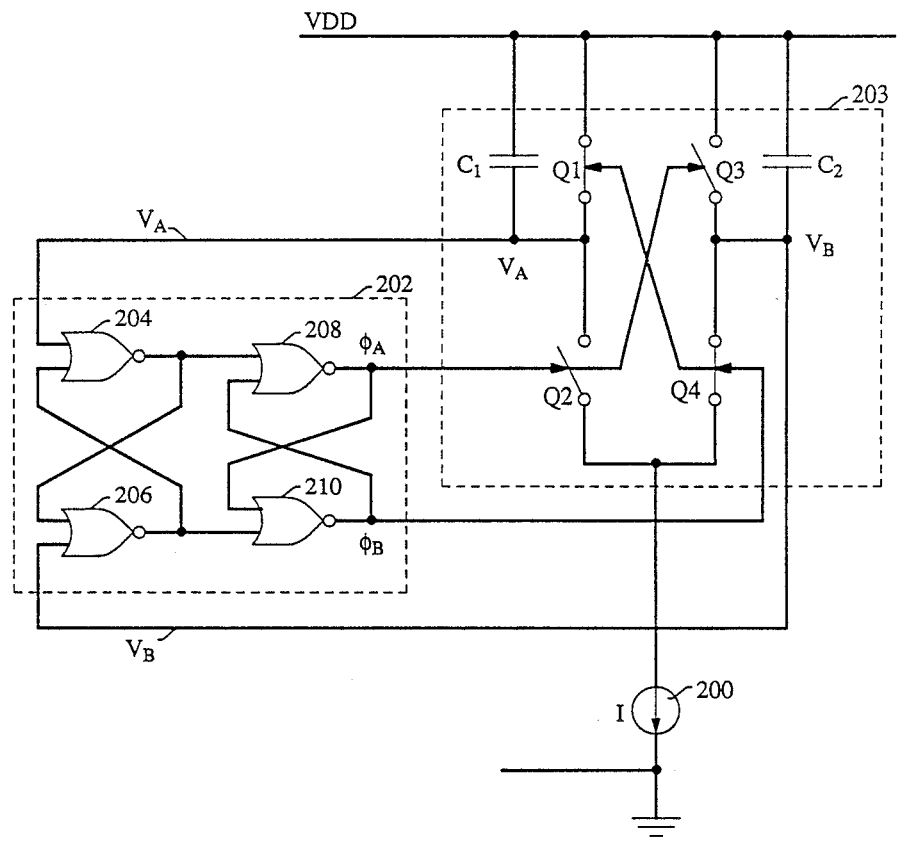
FIG. 2 shows an oscillator designed in MOS technology according to the principles of the invention and which achieves both wideband and high maximum frequency operation.

An illustrative CMOS circuit designed for high frequency and wideband operation in accordance with the principles of the invention is shown in FIG. 2. By way of example, this circuit is also a relaxation oscillator. As in the circuit of FIG. 1, this oscillator comprises a constant current source 200, a reversal circuit 202 (also referred to as a clock phase generating circuit) and a charging circuit 203. However, two AC-grounded charging capacitors C1 and C2 are used. While C1 and C2 may be fabricated elements, the AC-grounded arrangement allows C1 and C2 to be realized by transistor parasitics, such as the drain and source junction capacitances of the CMOS transistor switches Q2 and Q4 in MOS technology. Two switches, e.g., Q1 and Q4, are necessary for each capacitor to make the circuit insensitive to the finite on-resistance of such a switch, as will be discussed later. The use of only parasitic charging capacitances in the circuit of FIG. 2 is one factor that allows the circuit to operate at a very large maximum frequency. In fact, the only undesired parasitic capacitors in this circuit are the ones connected to the output of the current source 200. All other circuit nodes are either connected to AC ground or are charging nodes where the parasitics are useful. By attention to detail in the fabrication process, the circuit has topological and electrical symmetry or asymmetry that allows the circuit to operate at a 50% duty cycle output or other desired duty cycle. An important property of the circuit of FIG. 2 is that the negative plates of the capacitors C1 and C2 (assuming positive VDD) are independently connected through the four switches Q1 to Q4 to either the voltage supply VDD or to the current source 200. When the switching control signals $\Phi_A$ and $\Phi_B$ are complementary, the capacitors are discharged by the switches and charged by the current source periodically and alternately. The discharging is done instantaneously; the charging lasts for as long as the current source is connected to the capacitors C1 and C2. The maximum excursion $\Delta V$ of $V_A$ and $V_B$, a key parameter in the high frequency operation of the circuit, is directly proportional to the switching waveform period and to the value of the current supplied by source 200. The behavior of this circuit remains essentially the same, even though the switches Q1 to Q4 are non-ideal and have finite on-resistance, provided that the latter is not excessively high. As long as the finite rather than instantaneous discharging time is shorter than the charging time, the value of $\Delta V$ is substantially the same as it is in the ideal case in which the discharge time is zero. The charging of the capacitors is also unaffected by the on-resistance of Q1 through Q4 because the capacitors are connected in series with the current source. This is another factor that contributes to the desirable high frequency and wide bandwidth operation characteristics of the circuit.

The reversal circuit 202 contains a voltage comparator consisting of NAND gates 204 and 206 and a latch consisting of NAND gates 208 and 210. Circuit 202 is an improvement of the reversal circuit of FIG. 1. In contrast to the reversal circuit of FIG. 1, this circuit requires only a maximum of five gate delays instead of seven. This is yet another factor contributing to the desirable operation of the circuit. The two complementary output control signals $\Phi_A$ and $\Phi_B$ cannot change state until the voltage comparator detects that either $V_A$ or $V_B$ has fallen below a threshold value (e.g., $VDD-\Delta V$). As long as $\Phi_A$ and $\Phi_B$ are complementary, both capacitors C1 and C2 cannot be charged at the same time. When the propagation delay through the reversal circuit is much smaller than the C1 and C2 charging time, the oscillation frequency of the circuit is substantially proportional to the current I from source 200. The relatively fast response of the reversal circuit effectively keeps $\Delta V$ fixed, as set by the voltage comparator switching threshold. Then, the product between the oscillation period and the current I is a constant which physically represents twice the maximum charge accumulated on the capacitor C1 or C2. Therefore, the oscillator can be tuned over many orders of magnitude by varying the value of I. As the frequency is increased, a speed limitation is eventually approached at which the delay through the reversal circuit 202 becomes significant compared to the oscillation period. At this point, reducing the capacitor charging time further does not increase the frequency proportionally and the oscillator frequency versus I characteristics saturate. It is important, for maximum frequency of operation, that the reversal circuit 202 be as simple as possible. The reversal circuit consists of two latches 204-206 (L1) and 208-210 (L2). Two latches ensure sustained oscillations; a single-latch topology results in a circuit that can fail due to race conditions. L1 provides the function of voltage comparison. As long as $V_A$ and $V_B$ are logically high, both outputs of L1 are low, and the state of L2 remains unaltered. When the appropriate voltage $V_A$ or $V_B$ falls below the voltage threshold of L1, the state of L1 changes. This triggers a similar event in L2 as well. The reversal circuit is such that output switching waveform inversion is realized every time the latches L1 and L2 change states.

It is also possible to use NAND gate latches in the reversal circuit. However, this is not desirable for NMOS applications because of the inherent slower speed of NAND gates compared to that of NOR gates.

The illustrative reversal circuit 202 contains four gate delays in the signal path. The maximum speed of the charging circuit 203 for large values of the current I can be approximated by one gate delay, assuming parasitic capacitances are used for C1 and C2. Therefore, the top speed of this relaxation oscillator is expected to be substantially equal to that of a ring oscillator with five stages. This is a convenient way of evaluating the design because the performance of ring oscillators is a standard measure of fabrication process quality. A fine-line MOS process, for example, providing typical gate delays of 100 ps per gate yields a relaxation oscillator of the type discussed here with a maximum frequency of 1 GHz. In principle, the current switching mechanism of FIG. 2 is able to operate almost at zero frequency. In practice, however, the leakage currents at the charging nodes of C1 and C2 impose a maximum discharge time for the capacitors and, therefore, a minimum frequency of operation.

Figure 3:
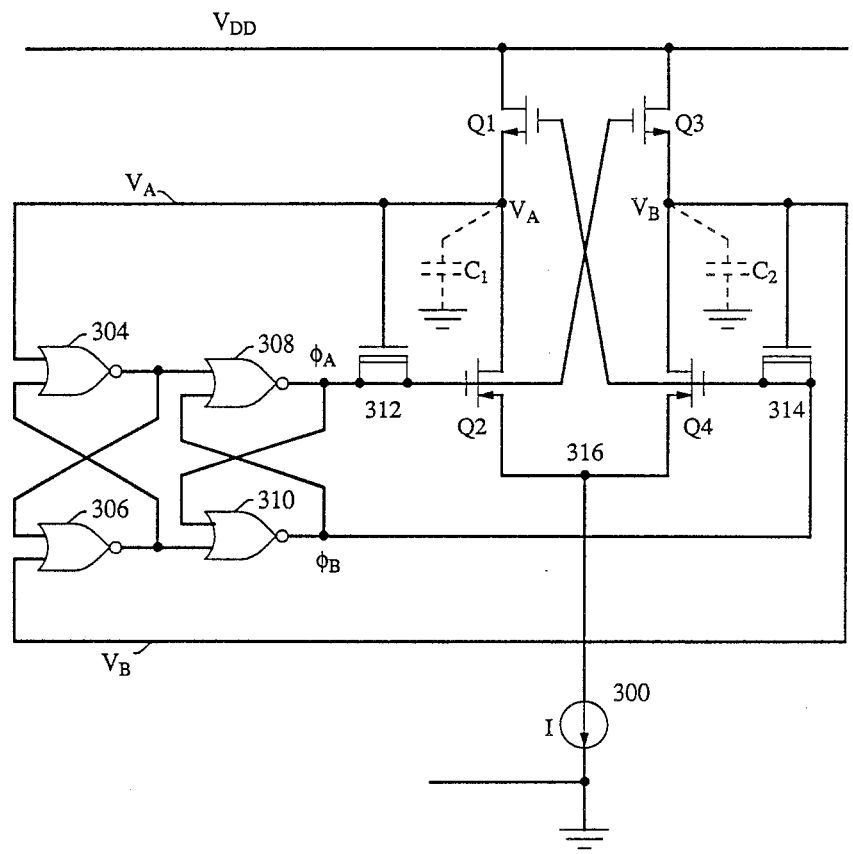
FIG. 3 shows the equivalent circuit of FIG. 2 designed in NMOS technology.

FIG. 3 illustrates an illustrative NMOS oscillator implementation. Transistors 312 and 314 are charge-depletion devices. Ignoring for the moment these depletion devices, it is seen that each switch in FIG. 2 has been replaced with a charge-enhancement n-channel MOS (NMOS) transistor. The source and drain parasitic capacitances C1 and C2 are used as charging capacitors. No additional reactive elements are used. In terms of the operation of the circuit, it does not make any difference that these capacitors are connected to ground and not to VDD as in the previous circuit; the only non-essential difference being that now the capacitors C1 and C2 are charged by VDD through Q1 and Q3 and discharged by the current source. On a more subtle note, it is pointed out that the cross-connection of the lower transistors Q2 and Q4 with the upper ones Q1 and Q3 ensures that the only oscillatory mode of the circuit is the desired one, as described before. This cross-connection is also necessary because in NMOS, only one type of switch is available. Thus, for example, when Q2 is on, Q4 is off, and the current source charges the parasitic capacitance C1; the transistor Q1 is off too, independently of the voltage at the output of the reversal circuit 302. In this way, the loop consisting of inverters containing the gate-drain of Q2, 304 and 308 are not closed, thus preventing this "three-stage ring oscillator" to operate. If the same scheme were implemented in CMOS using both types of switches (n-channel for the lower transistors Q2 and Q4 and p-channel for the upper transistors Q1 and Q3), the cross-connection would be absent, and the "three-stage ring oscillator" would be active. As a result, the circuit would have undesired and uncontrollable modes of oscillation and would not be useful. However, there is another similar scheme, dual to the one proposed here, that does not have this problem and allows the CMOS realization of the circuit.

Next, the purpose of the depletion transistors 312 and 314 is explained. The design of the charging circuit takes into account only some of the non-ideal characteristics of the technology, the parasitic capacitances C1 and C2, which were used to advantage, and the on-resistance of the switches which were rendered unimportant. However, there are other non-ideal characteristics whose presence hinders the proper operation of the circuit. First, C1 and C2 charge only up to VDD minus one transistor threshold voltage, which can be large due to the body effect. Then, when the second latch 308-310 changes state, the signals $\Phi_A$ and $\Phi_B$ are coupled to C1 and C2 through the gate-to-source parasitic capacitors of Q1 and Q3. Finally, when Q2 or Q4 turns on, the charge in C1 or C2, respectively, redistributes with the parasitic charge at node 316. Each of these three undesired effects decreases the potential on C1 or C2 before the current source 300 starts to discharge these capacitors. The combined result can be that the voltage at the input of the first latch drops below its switching level. If this happens the oscillator operates only at its maximum frequency and cannot be slowed down significantly by changes in the current source 300. The depletion MOSFET transistors 312 and 314 avoid this situation. Through their gate-to-channel capacitances, compensating charges are injected into C1 and C2. In this way, the detrimental effects mentioned previously are canceled. The depletion transistors are connected to take advantage of their nonlinear behavior. When the signals $\Phi_A$ and $\Phi_B$ change from a low level to a high level, the transistors 312 or 314, respectively, are strongly turned on, and the desired bootstrapping takes place. On the other hand, when $\Phi_A$ and $\Phi_B$ go from a high level to a low level, the transistors are off most of the time. This is beneficial because any signal coupling into C1 or C2 for this part of the cycle slows down the maximum speed of the oscillator.

Figure 4:
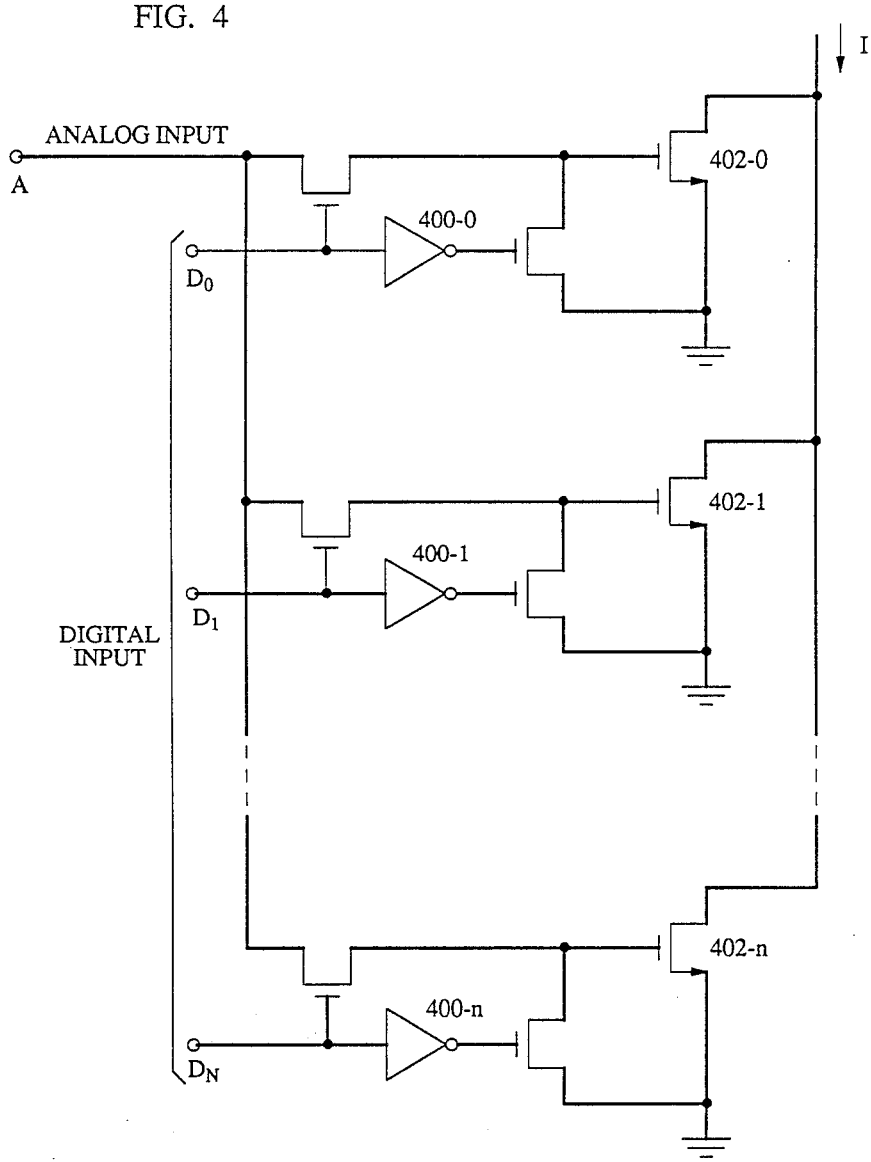
FIG. 4 shows a constant current circuit with analog and digital inputs for controlling the frequency of operation of the circuits designed in accordance with the invention.
Figure 5:
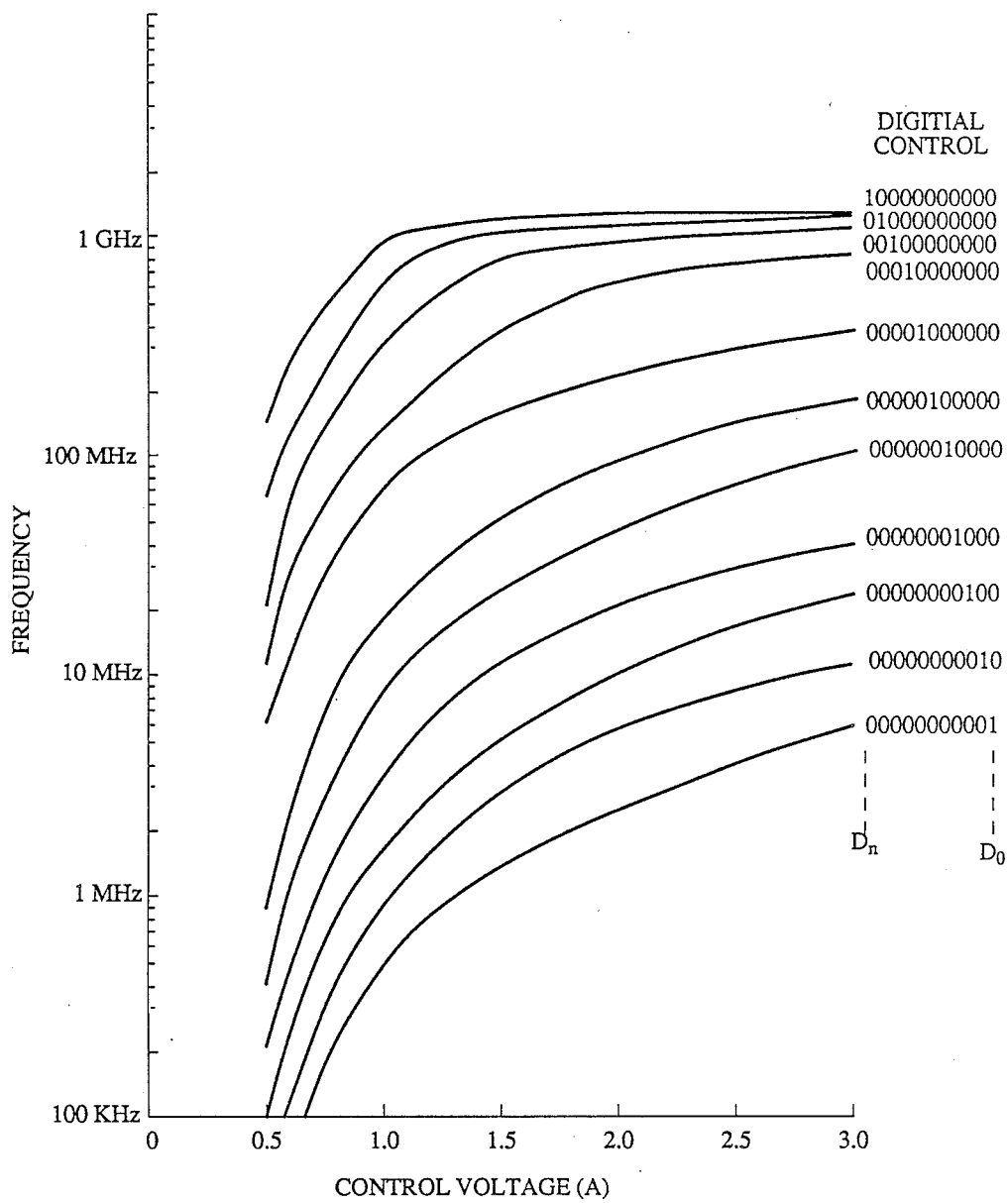
FIG. 5 shows a family of frequency versus analog input curves for the control circuit of FIG. 4, with the digital control inputs of FIG. 4 displayed as the running family variable, depicting the range of operation of circuits designed according to the principles discussed herein.

The current source 200 and 300 in FIGS. 2 and 3, respectively, may be simply implemented with one MOS transistor operated in saturation. In this case, the resulting circuit is a voltage-controlled oscillator (VCO). Adjusting the gate voltage of this MOSFET, the drain current can be changed over a wide range resulting in similarly wide frequency sweeps. In many applications, however, it is necessary to set the output frequency of the oscillator much more narrowly than is obtainable with a single saturated transistor. In this case, digital control means, for example, can be easily incorporated into the design of the circuit and may be used to set the level of current of the current source. This is accomplished by realizing the current source as a parallel combination of binary weighted transistors. In addition, analog voltage control can be provided for extra versatility. An illustrative digital and analog constant current control circuit is shown in FIG. 4. When used to form the current source 200 and 300 in FIGS. 2 and 3, respectively, it results in a digital voltage-controlled oscillator (DVCO). Binary weighted digital control signals D0 through DN are shown on the left of FIG. 4. An analog voltage control input A is also on the left. If any of the digital control signals D0–DN are high, the potential on the gates of the respective binary weighted transistors 400-0 to 400-N connect the analog voltage input A to the gate of an associated current drive transistor 402-0 through 402-N. The remaining current drive transistors 402 are turned off. A set of characteristic frequency curves are shown in FIG. 5, each represented by an indicated state of the digital control signals D0–DN, are plotted versus analog control voltage A. As seen, the level of current and the resulting operating frequency can be easily set with the control voltage A and then very finely tuned to a desired frequency with the digital control signals. The DVCO can be operated in two basic modes: (a) by keeping the analog input A constant, the output frequency can be adjusted digitally in finite steps, and (b) by freezing the digital inputs D0–DN to a desired binary weighted state, the output frequency can be varied continuously via the analog input. If the latter is restricted to high values compared to the threshold voltage of the transistors, the possible current changes are small. In this mode of operation, the DVCO is coarse tuned by the digital input and fine tuned by the analog input. However, if the analog input voltage is driven close to the transistor thresholds, the corresponding frequency sweep is very large.

The circuits of FIGS. 2 and 3 have been fabricated with an available 1-micron fine-line NMOS process. Transistor channel lengths were designed at 0.75 micron. All enhancement transistors were designed with channel lengths of 60 microns. The proper proportioning of the depletion transistors required a choice of 20 microns for their channel lengths. To minimize the parasitic capacitances, the transistors critical for high speed were assumed split in two identical parts that shared a common drain in the case of the enhancement transistors or a common source in the case of the depletion transistors. The necessary gate area of the bootstrapping transistors was found through computer simulation to be about 130 square microns. The fine-line DVCO, designed as described above, has been fabricated and tested. All results were obtained at wafer-level probing and with a three-volt power supply. To bring the oscillator output signals off the chip reasonably uncorrupted by reflections, transmission lines with a 50-ohm characteristic impedance were used. For the same reason, the biasing of the open-drain devices was applied through standard "Bias T" networks, properly terminated by the measuring instruments. Devices from several lots were tested. Their performance was essentially the same except for their maximum speed which varied approximately ±25% around 1.1 GHz. There was a strong correlation between the top speed observed and the effective transistor channel lengths in the wafers tested. Typically, the devices that had effective channel lengths of 0.5 micron or smaller operated at maximum speeds in excess of 1 GHz. By changing the analog and digital control inputs A and D0–DN in FIG. 4, the output frequency of the circuit could be varied from a maximum of approximately 1.4 GHz to about 80 KHz, or a tuning range exceeding four decades in frequency. For instance, by controlling the interruption of the current from the current source 200 or 300, a high-speed circuit may be obtained which counts the transitions of the reversal circuit 202 or 302 in the time period that the current is on. As yet another example, a high-speed frequency modulator may be formed by modulating the value of the current from 200 or 300.

It is understood that the above-described arrangements are merely illustrative of the application of principles of the invention and that other arrangements may be devised by workers skilled in the art without departing from the spirit and scope of the invention.

What is claimed is:

1. A relaxation oscillator comprising a switching network, a reversal circuit, a current source connected to said switching network and two charging capacitances whereby said reversal circuit controls said switching network in response to voltages appearing across said charging capacitances to periodically and alternately charge and discharge said charging capacitances at a frequency determined substantially by the size of said charging capacitances and the magnitude of the current from said current source characterized in that
   said charging capacitances comprise beneficial portions of parasitic capacitances in said switching network,
   said switching network further comprises means for counteracting the effects of detrimental portions of said parasitic capacitances.

2. The relaxation oscillator of claim 1 wherein said switching network comprises
   two pairs of charge-enhancement NMOS transistors, the source of the first transistor in each pair being connected to the drain of the second transistor in said pair and the gate of the first transistor in each pair being cross-connected to the gate of the second transistor in the other pair; said charging capacitances being substantially the source parasitic capacitances of said first transistors and the drain parasitic capacitances of said second transistors and said detrimental portion being substantially the gate-to-source parasitic capacitances of said first transistors and the source parasitic capacitances of said second transistors and wherein said means for counteracting further comprises
   a charge-depletion NMOS transistor for each pair of said charge-enhancement transistors, the gate of said charge-depletion transistor being connected to the drain of said second transistor of said pair, both the source and drain of said charge-depletion transistor being connected to the gate of said second transistor.

3. The relaxation oscillator of claim 1 or claim 2 wherein said reversal circuit comprises a first latch responsive to the voltages across said charging capacitances and a second latch responsive to signals from said first latch, said second latch being connected to control said switching network.

4. The circuit of claim 3 wherein said first and second latches each comprise two NOR gates.

5. A relaxation oscillator utilizing a switching network to charge and discharge at lease one charging capacitance
   characterized in that
   said charging capacitance substantially comprises beneficial portions of parasitic capacitance in said switching network and
   said oscillator further comprises means for counteracting detrimental portions of said parasitic capacitance.

6. The relaxation oscillator of claim 5 wherein said switching network comprises at least one charge-enhancement NMOS transistor and said means for counteracting comprises at least one charge-depletion NMOS transistor.

* * * * *